(12) United States Patent
Pelissier et al.

(10) Patent No.: US 6,456,139 B1
(45) Date of Patent: Sep. 24, 2002

(54) AUTO-DETECTION AND AUTO-ENABLE OF COMPACT PCI BUS PULL-UPS

(75) Inventors: Gerald R. Pelissier, Austin, TX (US); David S. Hwang, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/693,585

(22) Filed: Oct. 20, 2000

(51) Int. Cl.[7] .................................................. H03K 5/08
(52) U.S. Cl. ........................ 327/322; 327/308; 327/519
(58) Field of Search ................................. 327/530, 534, 327/535, 536, 537, 538, 539, 540, 541, 322, 308, 519, 306, 108; 326/30, 82, 83, 86, 87

(56) References Cited

U.S. PATENT DOCUMENTS 5,856,756 A * 1/1999 Sasahara et al. ............ 327/540
5,867,056 A * 2/1999 Zoellick ..................... 327/541

* cited by examiner

*Primary Examiner*—Tuan T. Lam
*Assistant Examiner*—Hiep Nguyen
(74) *Attorney, Agent, or Firm*—Rosenthal & Osha L.L.P.

(57) ABSTRACT

A device for automatically varying resistance includes a comparator for comparing a control voltage to a reference voltage; a switch operatively coupled to the comparator; and a first resistor and second resistor operatively coupled in a series connection between a pull-up voltage and a signal line. The switch is operatively coupled in a parallel connection with the first resistor and, based on the comparison between the control voltage and the reference voltage, the switch selectively bypasses the first resistor. A method of automatically varying resistance includes comparing a control voltage and a reference voltage; pulling-up a signal line to a pull-up voltage through a first resistor and a second resistor operatively connected in series if the comparison has a first outcome; and pulling up the signal line to the pull-up voltage through only the second resistor if the comparison has a second outcome.

12 Claims, 5 Drawing Sheets

AUTO-DETECTION AND AUTO-ENABLE OF COMPACT PCI BUS PULL-UPS

BACKGROUND OF THE INVENTION

Referring to FIG. 1, a computer is generally comprised of, among other elements, a motherboard (10), a central processing unit (CPU) (12), memory (14), and a plurality of circuit cards (16) for controlling components, performing functions, and the like. Most of these elements are inserted or otherwise electrically connected to the motherboard. Computer system components are generally connected via buses (18) or an electrically-conductive path traced along the motherboard. These buses are used for data transfer among the components. Further, power is delivered to the motherboard through a power connection (20). Then, depending on the component, power is supplied indirectly from the motherboard (10) or directly via a power connection on the component. In certain systems, the elements can be removed from or inserted into the computer while the system is running, i.e., the elements can be "hot-swapped." There exist standard specifications that allow the combination of components from different manufacturers. ISA (Industry Standard Architecture) is a bus specification that is based on the specification used in the IBM PC/XT and PC/AT. PCI (Peripheral Component Interconnect) is a local bus specification developed for 32-bit or 64-bit computer system interfacing. Most modem computers have both an ISA bus for slower devices and a PCI bus for devices that need better bus performance. Another specification, VME (VersaModule Eurocard bus), is a 32-bit bus widely used in industrial, commercial, and military applications. VME64 is an expanded version that provides 64-bit data transfer and addressing.

While it is generally cost effective to have most of the circuitry on a single large motherboard for desktop computers, such a configuration has certain drawbacks that are particularly important to industrial applications. Because the motherboard is usually thin and large enough to flex, breakage of small traces and solder joints on fine pitch surface mount devices may occur when plug-in boards are inserted. The occurrence of such breakage requires motherboard replacement, which in turn requires complete disassembly and reassembly of the computer system.

Particularly in industrial applications, such disassembly and reassembly, and the accompanying downtime, may be unacceptable. Also, given the rapid development of motherboard technology, finding an exact replacement for a motherboard can be difficult or impossible. Further, substitution of a non-exact replacement may cause software problems due to BIOS changes, changing device drivers, and different timing. Thus, standard specifications have been developed for systems and boards designed for use in industrial and telecommunications computing applications.

The PCI-ISA passive backplane standard defines backplane and connector standards for plug-in passive backplane CPU boards that bridge to both PCI and ISA buses. The PCI-ISA passive backplane standard moves all of the components normally located on the motherboard to a single plug-in card. The motherboard is replaced with a passive backplane that only has connectors soldered to it.

CompactPCI is a specification for PCI-based industrial computers that is electrically a superset of PCI with a different physical form factor. CompactPCI uses the Eurocard form factor popularized by the VME bus.

In the PCI specification, it was possible to select a single value for the pull-up resistor that would satisfy the requirement for both 3.3V and 5V backplanes. Therefore, it was possible to create Universal Signaling Environment capable cards. There is a mechanism defined by the PCI specification where the "signaling environment" of the bus is defined by the value of the pins receiving the input/output (I/O) voltage, i.e., the VIO pins (either 3.3V or 5V). Thus, a universal card uses the I/O voltage VIO to define its own I/O voltage, rather than fixing it at 5V or 3.3V.

The CompactPCI bus architecture supports the 3.3V signaling environment, the 5V signaling environment, and hot swap. These features have the following corresponding requirements. The 3.3 V signaling environment requires 2.7 K Ohm ($\Omega$) (+/-5%) pull-up resistors. The 5V signaling environment requires 1.0 K$\Omega$ (+/-5%) pull-up resistors. Hot Swap requires that all pins be biased at 1V (+/-20%) using a minimum 10K$\Omega$ pull-up resistor. Further, the Compact PCI specification has the additional requirements of a 10$\Omega$ series termination resistor on every signal within 0.6' of the connector pin, no more than 10 Pico-Farad (pf) capacitive load on any shared bus signal on a non-system slot board, and no more than 20 pf capacitive load on any shared bus signal on a system slot board.

There are two types of "universal" boards: Universal signaling environment and universal slot location. Universal signaling environment means that a board can operate in either a 3.3V or 5V bus backplane. With the original PCI specification, it was possible to select a value for the bus pull-up resistor that satisfied the specification for both the 3.3V and 5V signaling environments. With the new CompactPCI Specification, it is no longer possible to select a single resistor. Therefore, in order to be a universal signaling environment capable CompactPCI board, a board must provide both 2.7 K$\Omega$ (+/-5%) and 1.0 K$\Omega$ (+/-5%) pull-up resistors and provide a way to enable them correctly depending on the signaling environment.

Universal slot location describes a board that can function in either the system slot or non-system slot of a CompactPCI backplane. A system slot board is required to provide the common bus resources for the CompactPCI backplane, namely: bus pull-ups, bus clock, and the bus arbiter. A system slot board is allowed additional capacitive load per signal pin because of these additional features. In order to be CompactPCI Hot Swap Specification compliant, every signal pin must be biased to (1V +/-20%) through a minimum 10 K$\Omega$ resistor prior to insertion into a live or "hot" backplane.

Those skilled in the art will appreciate that other requirements exist in the full CompactPCI, Hot Swap, and Passive Backplane PCI-ISA specifications which are available from PCI Industrial Computer Manufacturers Group of Wakefield, Mass. and are hereby incorporated in their entirety by reference.

SUMMARY OF THE INVENTION

In one aspect, a device for automatically varying resistance comprises a comparator for comparing a control voltage to a reference voltage; a switch operatively coupled to the comparator; and a first resistor and second resistor operatively coupled in a series connection between a pull-up voltage and a signal line. The switch is operatively coupled in a parallel connection with the first resistor and, based on the comparison between the control voltage and the reference voltage, the switch selectively bypasses the first resistor.

In one aspect, a method of automatically varying resistance comprises comparing a control voltage and a reference voltage; pulling-up a signal line to a pull-up voltage through a first resistor and a second resistor operatively connected in series if the comparison has a first outcome; and pulling up the signal line to the pull-up voltage through only the second resistor if the comparison has a second outcome.

In one aspect, an apparatus for automatically varying resistance comprises means for comparing a control voltage and a reference voltage; means for pulling-up a signal line to a pull-up voltage through a first resistor and a second resistor operatively connected in series if the comparison has a first outcome; and means for pulling up the signal line to the pull-up voltage through only the second resistor if the comparison has a second outcome.

In one aspect, a computer system for automatically varying resistance comprises a voltage supply for supplying a reference voltage and an operating voltage; a signal line requiring a pull-up resistance of a differing value depending on the operating voltage; a comparator for comparing the reference voltage and the operating voltage; a pass gate controlled by an output of the comparator; a first resistor operatively coupled between the signal line and a first side of a parallel connection of the pass gate and a second resistor; and a second side of the parallel connection of the pass gate and the second resistor operatively coupled to the operating voltage.

In one aspect, a custom integrated circuit (IC) for automatically varying resistance comprises a comparator for comparing a input/output voltage to a reference voltage operatively coupled to a first comparator terminal and second comparator terminal of the custom IC; an NMOS transistor having the output of the comparator operatively coupled to a gate of the NMOS transistor, and a source and a drain of the NMOS transistor operatively coupled across a 1.7 KΩ resistor; and the 1.7 KΩ resistor and a 1.0 KΩ resistor operatively coupled in series between a first pull-up terminal of the custom IC and a second pull-up terminal of the custom IC. The source of the NMOS transistor and a first side of the 1.7 KΩ resistor are operatively coupled to the first pull-up terminal of the custom IC, the drain of the NMOS transistor and a second side of the 1.7 KΩ resistor are operatively coupled to a first side of the 1.0 KΩ resistor, and a second side of the 1.0 KΩ resistor is operatively coupled to the second pull-up terminal of the custom IC. The input/output voltage is applied to the first comparator terminal and the first pull-up terminal, the reference voltage is applied to the second comparator terminal, and a signal line to be pulled-up is connected to the second pull-up terminal.

In one aspect, a custom integrated circuit (IC) for automatically varying resistance comprises a comparator for comparing a input/output voltage to a reference voltage operatively coupled to a first comparator terminal and second comparator terminal of the custom IC; an NMOS transistor having the output of the comparator operatively coupled to a gate of the NMOS transistor, and a source and a drain of the NMOS transistor operatively coupled across a 2.7 KΩ resistor; a PMOS transistor having the output of the comparator operatively coupled to a gate of the NMOS transistor and a source and a drain of the PMOS transistor operatively coupled across a 1.0 KΩ resistor; and the 2.7 KΩ resistor and the 1.0 KΩ resistor operatively coupled in series between a first pull-up terminal of the custom IC and a second pull-up terminal of the custom IC. The source of the NMOS transistor and a first side of the 2.7 KΩ resistor are operatively coupled to the first pull-up terminal of the custom IC, the drain of the NMOS transistor and a second side of the 2.7 KΩ resistor are operatively coupled to the source of the PMOS transistor and a first side of the 1.0 KΩ resistor, and the drain of the PMOS transistor and a second side of the 1.0 KΩ resistor are operatively coupled to the second pull-up terminal of the custom IC. The input/output voltage is applied to the first comparator terminal and the first pull-up terminal, the reference voltage is applied to the second comparator terminal, and a signal line to be pulled-up is connected to the second pull-up terminal. Other aspects and advantages of the invention will be apparent from the following description and the appended claims.

DETAILED DESCRIPTION OF THE INVENTION

Figure 1:
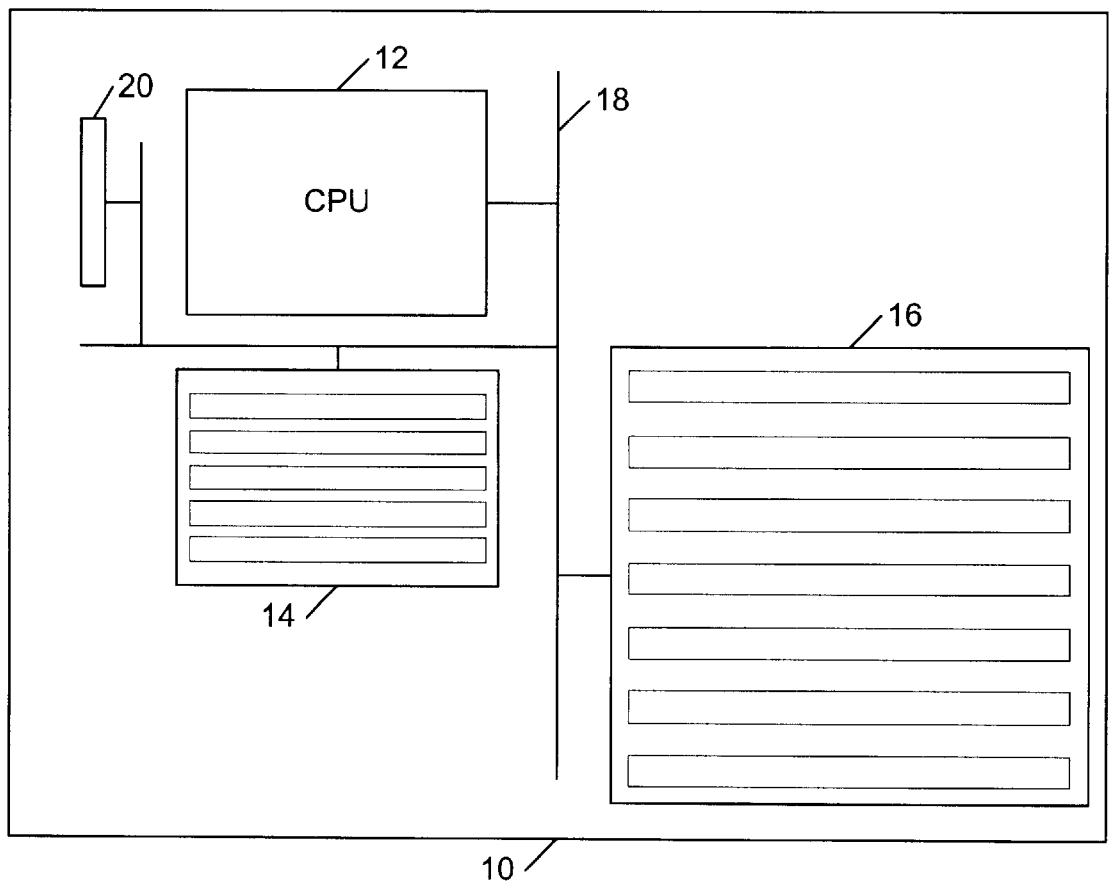
FIG. 1 a block diagram of a typical computer.
Figure 2:
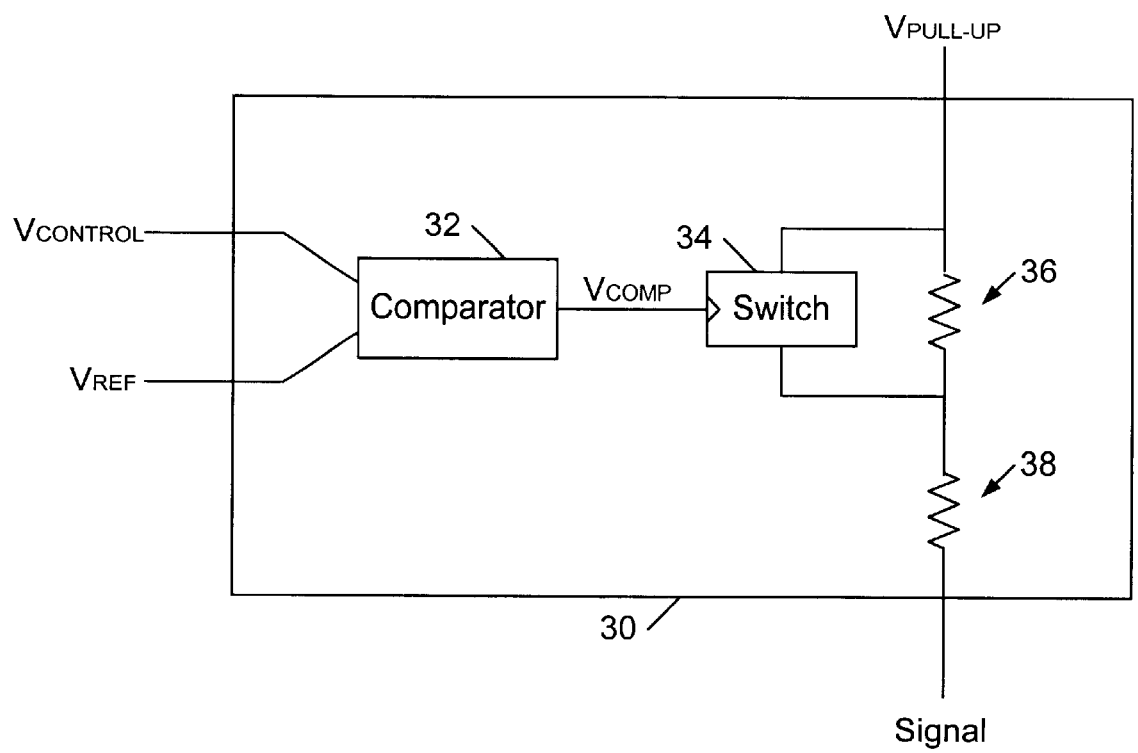
FIG. 2 a block diagram in accordance with an embodiment of the present invention.

In one or more embodiments, the present invention involves an auto-detect, auto-enable variable resistance device. Referring to the drawings wherein like reference characters are used for like parts throughout the several views, FIG. 2 shows a circuit diagram of a device in accordance with an embodiment of the present invention. The exemplary embodiments presented below are discussed with reference to voltages, the present invention is equally applicable to connections to any signal, i.e., electrical, optical, etc.

Referring to FIG. 2, a device (30) is shown which automatically varies between resistor values based on a change in operating voltage. In the example shown, the device (30) is connected to a variable control voltage ($V_{CONTROL}$), a known reference voltage ($V_{REF}$), a pull-up voltage ($V_{PULL-UP}$), and a signal line (SIGNAL). The device (30) acts as a variable pull-up resistor for the signal line (SIGNAL) to the pull-up voltage ($V_{PULL-UP}$). The device (30) includes a comparator (32), which is used to compare the variable control voltage ($V_{CONTROL}$) to the known reference voltage ($V_{REF}$). The output of the comparator ($V_{COMP}$) is then used to enable switch (34).

Two resistors (36, 38) are connected between the pull-up voltage ($V_{PULL-UP}$) and the signal line (SIGNAL). The switch (34) is connected across resistor (36). Depending on whether the comparator output ($V_{COMP}$) enables the switch (34), switch (34) acts as a closed or open circuit. If the switch (34) is enabled, resistor (36) is bypassed and the pull-up resistance of the device (30) is equal to resistor (38). On the other hand, if switch (34) is not enabled by comparator output ($V_{COMP}$), resistors (36) and (38) are connected in series and the pull-up resistance of the device (30) is equal to the sum of the values of the resistors (36, 38).

Accordingly, if the variable control voltage ($V_{CONTROL}$), which determines the resistance value of the device (30), is equal to the pull-up voltage ($V_{PULL-UP}$), which equates to the operational signaling environment, the signaling environment will dictate the resistance value of the device (30). Given that, when the signaling environment changes, the device (30) will automatically change resistance. By selecting desired values for the resistors (36, 38), the device (30) will automatically detect the signaling environment and automatically enable the appropriate resistance for that environment.

A universal card created in accordance with the CompactPCI Bus Specification requires both 3.3V and 5V signaling environment capabilities. Further, depending on the signaling environment, different values of pull-up resistors are required. Specifically, 2.7 KΩ pull-up resistors are required for a 3.3V signaling environment and 1.0 KΩ pull-up resistors are required for a 5V signaling environment.

Figure 3:
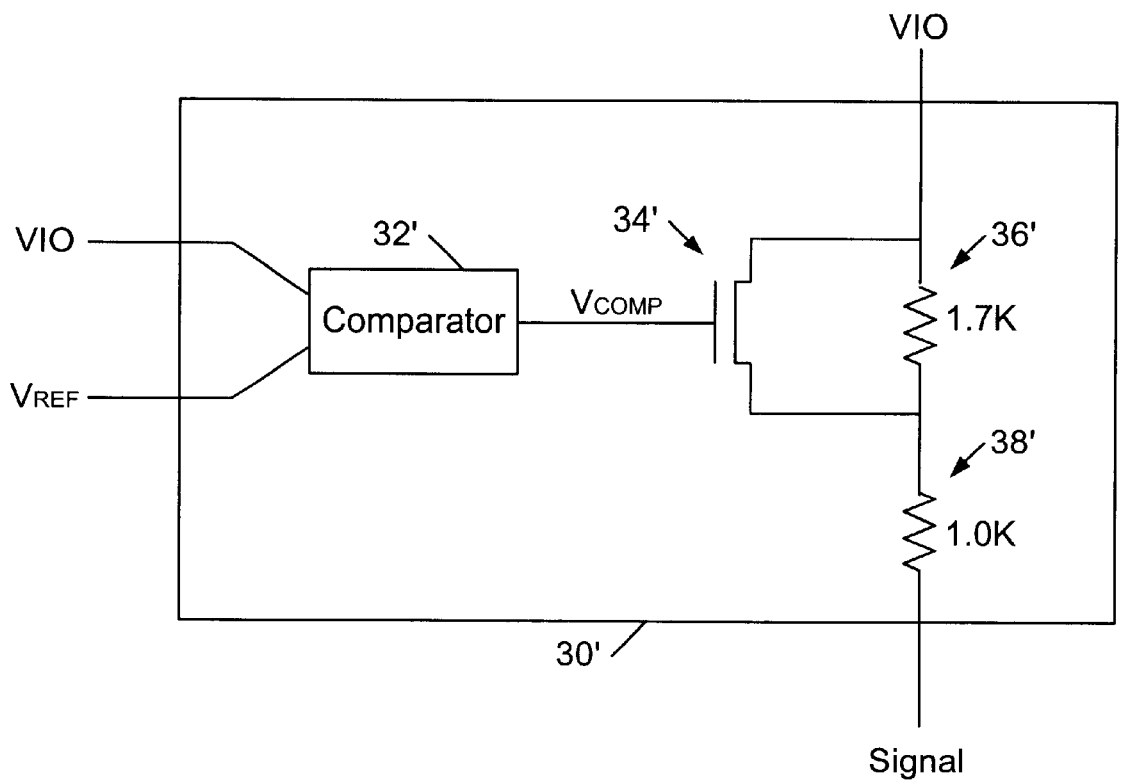
FIG. 3 a circuit diagram in accordance with the embodiment of FIG. 2.

Referring to FIG. 3, an integrated circuit (IC) (30') is shown which automatically varies between 1.0 KΩ and 2.7 KΩ resistance based on a change in operating voltage. In the example shown, the IC (30') is connected to a variable input/output voltage (VIO), a known reference voltage ($V_{REF}$), and a signal line (SIGNAL). The IC (30') acts as a variable pull-up resistor for the signal line (SIGNAL) to the input/output voltage (VIO). The IC (30') includes a comparator (32), which is used to compare the input/output voltage (VIO) to the known reference voltage ($V_{REF}$). The output of the comparator ($V_{COMP}$) is then used to enable, for example, an NMOS transistor (34') configured as a "pass gate." As those skilled in the art will appreciate, a pass gate is a single transistor where the input is connected to the source terminal, the output is connected to the drain terminal, and the control pin is connected to the gate terminal. Such a configuration allows a signal to pass through the transistor when the gate is open. As can be seen, the output of the comparator ($V_{COMP}$) is fed to the gate of the transistor (34'). The source and drain connections of the transistor (34') are connected across a 1.7 KΩ resistor (36'). Also, the input/output voltage (VIO) is applied to the source of transistor (34'), and a 1.0 KΩ resistor (38') is connected between the drain of transistor (34') and the signal line (SIGNAL).

Thus, as discussed above, depending on whether the gate of transistor (34') is open, the 1.7 KΩ resistor (36') is bypassed. When the 1.7 KΩ resistor (36') is bypassed, the IC (30') acts as a 1.0 KΩ pull-up resistor. On the other hand, when the 1.7 KΩ resistor (36') is not bypassed, the IC (30') acts as a 2.7 KΩ pull-up resistor. Accordingly, by setting the reference voltage ($V_{REF}$) to 3.3V (or 5V depending on whether the output of the comparator is high or low), the signal line will automatically be pulled-up across the proper resistance because the input/output voltage received (VIO) dictates the resistance value of the IC (30'). Further, those skilled in the art will appreciate that a PMOS transistor could be used in place of the NMOS transistor with the effect being that the gate would be open inversely given similar inputs.

Figure 4:
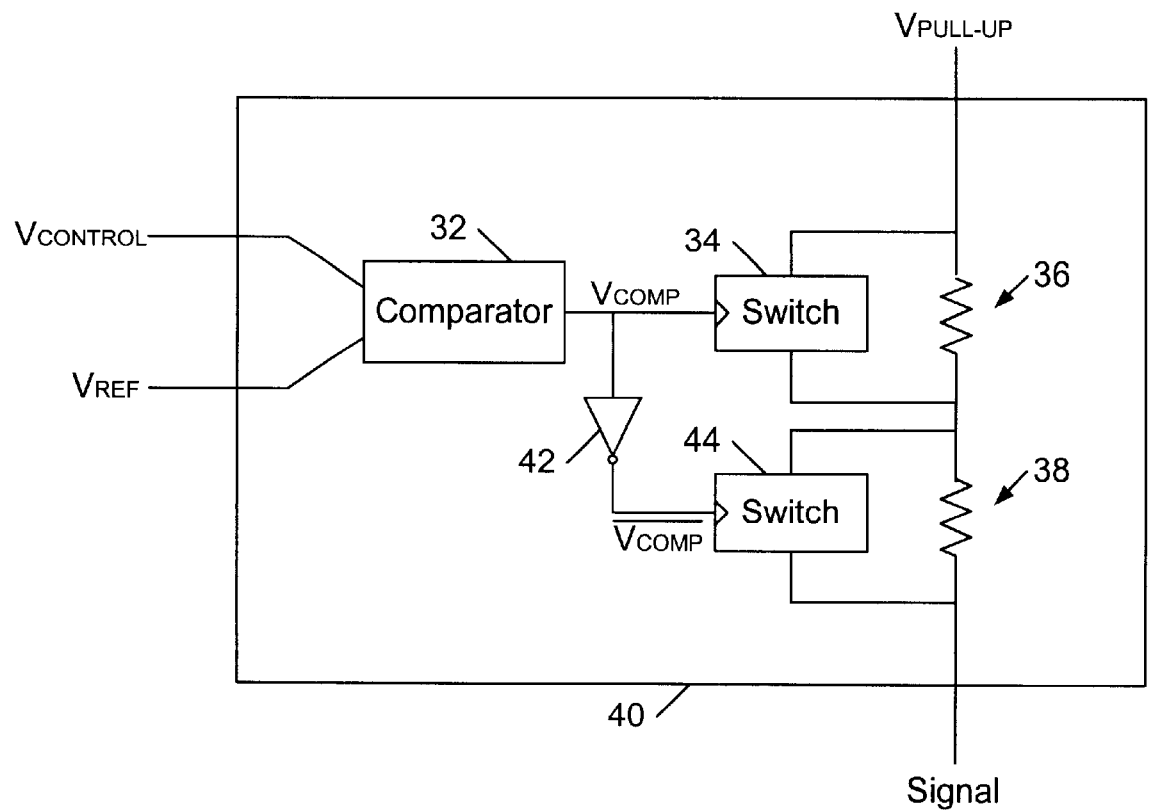
FIG. 4 a block diagram in accordance with an embodiment of the present invention.

Referring to FIG. 4, a device (40) is shown which automatically varies between resistor values based on a change in operating voltage. In the embodiment shown, the device (40) is connected to a variable control voltage ($V_{CONTROL}$), a known reference voltage ($V_{REF}$), a pull-up voltage ($V_{PULL-UP}$), and a signal line (SIGNAL). The device (40) acts as a variable pull-up resistor for the signal line (SIGNAL) to the pull-up voltage ($V_{PULL-UP}$). The device (40) includes a comparator (32), which is used to compare the variable control voltage ($V_{CONTROL}$) to the known reference voltage ($V_{REF}$). The output of the comparator ($V_{COMP}$) is then used to enable switch (34). The output of the comparator ($V_{COMP}$) is also passed through an inverter (42) and the resulting inverse signal ($\overline{V_{COMP}}$) is then used to enable switch (44).

Two resistors (36, 38) are connected between the variable control voltage ($V_{CONTROL}$) and the signal line (SIGNAL). The switch (34) is connected across resistor (36) and switch (44) is connected across resistor (38). Depending on whether the comparator output ($V_{COMP}$) enables the switch (34), switch (34) acts as a closed or open circuit. Likewise, depending on whether the inverse of the comparator output ($\overline{V_{COMP}}$) enables the switch (44), switch (44) acts as a closed or open circuit. Thus, if the switch (34) is enabled, switch (44) will not be enabled and resistor (36) is bypassed, which results in the pull-up resistance of the device (40) being equal to the value of resistor (38). On the other hand, if the switch (34) is not enabled, switch (44) will be enabled and resistor (38) will be bypassed, which results in the pull-up resistance of the device (40) being equal to the value of resistor (36).

Figure 5:
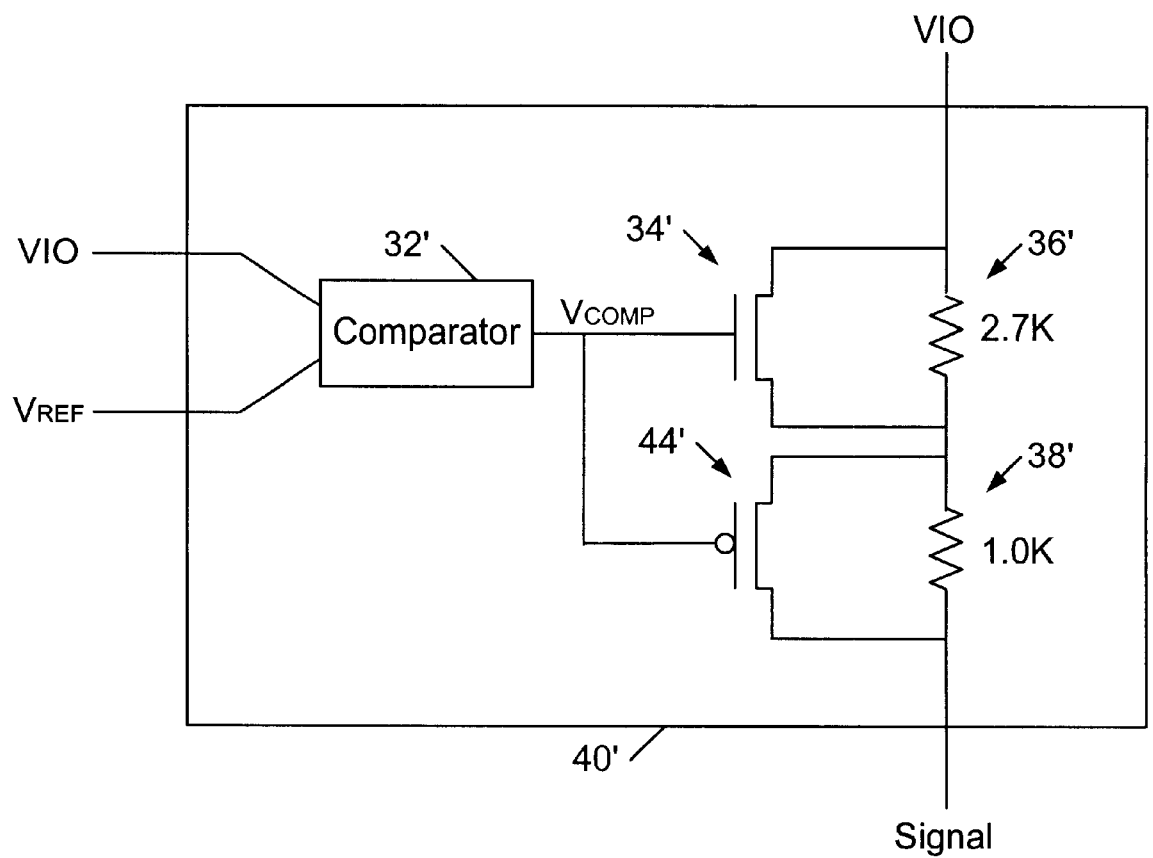
FIG. 5 a circuit diagram in accordance with the embodiment of FIG. 3.

Referring to FIG. 5, a IC (40') is shown which automatically varies between 1.0 KΩ and 2.7 KΩ resistance based on a change in operating voltage. In the example shown, the IC (40') is connected to a variable input/output voltage (VIO), a known reference voltage ($V_{REF}$), and a signal line (SIGNAL). The IC (40') acts as a variable pull-up resistor for the signal line (SIGNAL) to the input/output voltage (VIO). The IC (40') includes a comparator (32'), which is used to compare the input/output voltage (VIO) to the known reference voltage ($V_{REF}$). The output of the comparator ($V_{COMP}$) is then used to enable an NMOS transistors (34') and PMOS transistor (44'), both configured as pass gates.

As can be seen, the output of the comparator ($V_{COMP}$) is fed to the gates of the transistors (34', 44'). The source and drain connections of the transistor (34') are connected across a 2.7 KΩ resistor (36'), while the source and drain connections of the transistor (44') are connected across a 1.0 KΩ resistor (38'). Also, the input/output voltage (VIO) is applied to the source of transistor (34'), and the drain of transistor (44') is connected to the signal line (SIGNAL).

Depending on whether the comparator output ($V_{COMP}$) enables the NMOS transistor (34'), transistor (34') acts as a closed or open circuit. Inversely, because transistor (44') is a PMOS transistor, transistor (44') is enabled, and thereby acts as a closed or open circuit, depending on the inverse of the comparator output ($\overline{V_{COMP}}$). Thus, if the transistor (34') is enabled, transistor (44') will not be enabled, resistor (36') is bypassed, and the pull-up resistance of the IC (40') is equal to the value of resistor (38'). On the other hand, if the transistor (34') is not enabled, transistor (44') will be enabled, resistor (38') will be bypassed, and the pull-up resistance of the IC (40) is equal to the value of resistor (36').

Thus, as discussed above, depending on whether the gate of transistor (34') or transistor (44') is open, the 2.7 KΩ (36') or the 1.0 KΩ resistor (38') is bypassed. When the 2.7 KΩ resistor (36') is bypassed, the IC (40') acts as a 1.0 KΩ pull-up resistor. On the other hand, when the 2.7 KΩ resistor (36') is not bypassed, the 1.0 KΩ resistor is bypassed and the IC (40') acts as a 2.7 KΩ pull-up resistor. Accordingly, by setting the reference voltage ($V_{REF}$) to 3.3V (or 5V depending on whether the output of the comparator is high or low), the signal line will automatically be pulled-up across the proper resistance because the input/output voltage received (VIO) dictates the resistance value of the IC (40').

Further, those skilled in the art will appreciate that the positions of the NMOS and PMOS transistors could be reversed, or both transistors could be either NMOS or PMOS transistors if an inverter is operatively coupled between the output of the comparator and one of the transistors.

Advantages of the present invention may include one or more of the following. In one or more embodiments, the present invention provide a method and a device that automatically detect an operational voltage and vary resistance accordingly. The device complies with the CompactPCI specification requirements. In a CompactPCI environment, the proper resistance (1.0 KΩ or 2.7 KΩ) is enabled/disabled automatically. Cost is reduced because several discrete components are integrated into a single specialized IC. Further, by integrating all of the features in an IC, board space is saved. Saving space is important in dense signal board computers such as CompactPCI boards. Board design is made easier, which saves potential development costs.

While the invention has been described with respect to a limited number of embodiments, those skilled in the art will appreciate that other embodiments can be devised which do not depart from the scope of the invention as disclosed herein. Accordingly, the scope of the invention should be limited only by the attached claims.

What is claimed is:

1. A device for automatically varing resistance comprising:

a comparator for comparing a control voltage to a reference voltage;

a first switch operatively coupled to the output of the comparator;

a first resistor and second resistor operatively coupled in a series connection between a pull-up voltage and a signal line, wherein the first switch is operatively coupled in a parallel connection with the first resistor and, based on the comparison between the control voltage and the reference voltage, the first switch selectively bypasses the first resistor; and a second switch operatively coupled to the output of the comparator, wherein the second switch is operatively coupled in a parallel connection with the second resistor and, based on the comparison between the control voltage and the reference voltage, the second witch selectively bypasses the second resistor.

2. The device of claim 1 wherein the control voltage is equal to the pull-up voltage.

3. The device of claim 1 further comprising:

an inverter operatively coupled between the comparator and the second switch such that only one of the switch and the second switch may bypass at a given time.

4. The device of claim 1 wherein the switch is an NMOS transistor and the second switch is a PMOS transistor.

5. The device of claim 3 wherein the switch is an NMOS transistor and the second switch is an NMOS transistor.

6. The device of claim 1 wherein the first resistor is a 1.0 KΩ resistor and the second resistor is a 2.7 KΩ resistor.

7. A method of automatically varying resistance comprising:

comparing a control voltage and a reference voltage;

connecting a first resistor and a second resistor in series;

pulling up the signal line to the pull-up voltage through only the second resistor when the comparison has a second output; and pulling-up the signal line to the pull-up voltage through only the first resistor when the comparison has the first output.

8. An apparatus for automatically varying resistance comprising:

means for comparing a control voltage and a reference voltage;

a first resistor and a second resistor operatively connected in series;

means for pulling up the signal line to the pull-up voltage through only the second resistor when the comparison has a second output; and means for pulling-up the signal line to the pull-up voltage through only the first resistor when the comparison has the first output.

9. The apparatus of claim 8 wherein only one of the means for selectively bypassing the first resistor and the means for selectively bypassing the second resistor is activated at a given time.

10. A computer system for automatically varying resistance comprising:

voltage supply for supplying a reference voltage and an operating voltage;

a signal line requiring a pull-up resistance of a differing value depending on the operating voltage;

a comparator for comparing the reference voltage and the operating voltage;

a first pass gate controlled by an output of the comparator;

a first resistor operatively coupled between the signal line and a first side of a parallel connection of the first pass gate and a second resistor;

a second side of the parallel connection of the first pass gate and the second resistor operatively coupled to the operating voltage;

an inverter coupled between the output of the comparator and a second pass gate for inverting the output of the comparator; and the second pass gate controlled by an inverse of the output of the comparator and operatively coupled in parallel with the first resistor.

11. The computer system of claim 10 wherein the first resistor is a 1.0 KΩ resistor and the second resistor is a 2.7 KΩ resistor.

12. A custom integrated circuit (IC) for automatically varing resistance comprising:

a comparator for comparing an input/output voltage to a reference voltage operatively coupled to a first comparator terminal and second comparator terminal of the custom IC;

an NMOS transistor having the output of the comparator operatively coupled to a gate of the NMOS transistor, and a source and a drain of the NMOS transistor operatively coupled across a 2.7 KΩ resistor; and a PMOS transistor having the output of the comparator operatively coupled to a gate of the PMOS transistor and a source and a drain of the PMOS transistor operatively coupled across a 1.0 KΩresistor; and the 2.7 KΩ resistor and the 1.0 KΩ resistor operatively coupled in series between a first pull-up terminal of the custom IC and a second pull-up terminal of the custom IC, wherein the source of the NMOS transistor and a first side of the 2.7 KΩ resistor are operatively coupled to the fist pull-up terminal of the custom IC, the drain of the NMOS transistor and a second side of the 2.7 KΩ resistor are operatively coupled to the source of the PMOS transistor and a first side of the 1.0 KΩ resistor, the drain of the PMOS transistor and a second side of the 1.0 KΩ resistor are operatively coupled to the second pull-up terminal of the custom IC, the input/output voltage is applied to the first comparator terminal and the first pull-up terminal, the reference voltage is applied to the second comparator terminal, and a signal line to be pulled-up is connected to the second pull-up teal.

* * * * *

UNITED STATES PATENT AND TRADEMARK OFFICE
CERTIFICATE OF CORRECTION

PATENT NO.    : 6,456,139 B1                                              Page 1 of 1
DATED         : September 24, 2002
INVENTOR(S)   : Gerald R. Pelissier et al.

It is certified that error appears in the above-identified patent and that said Letters Patent is hereby corrected as shown below:

Column 7,
Line 14, please replace "witch" with -- switch --;
Line 42, please delete the word "operatively".

Column 8,
Line 5, please replace "a" with -- the --;
Line 13, please replace "a" with -- the --;
Line 35, please insert a space between "KΩ" and "resistor";
Line 56, please replace "teal" with -- terminal --.

Signed and Sealed this

Eighteenth Day of February, 2003

JAMES E. ROGAN
*Director of the United States Patent and Trademark Office*